US005430407A

United States Patent [19]

Dong

[11] Patent Number: 5,430,407

[45] **Date of Patent: * Jul. 4, 1995**

[54] VOLTAGE SQUARER USING BACKWARD DIODES

[76] Inventor: Xianzhi Dong, 6-103 Libu Hutong, Kuan Jie, Beijing 100007, China

[ * ] Notice: The portion of the term of this patent subsequent to Jun. 4, 2010 has been disclaimed.

[21] Appl. No.: 309,529

[22] Filed: Sep. 20, 1994

Related U.S. Application Data

[63] Continuation of Ser. No. 692,188, Apr. 26, 1991, abandoned.

[30] Foreign Application Priority Data

May 8, 1990 [CN] China ............................. 90102514.3

[51] Int. Cl.[6] ........................ G06G 7/20; H03L 17/70

[52] U.S. Cl. .................................... 327/349; 327/334; 327/568; 327/569

[58] Field of Search ................ 328/144, 145; 307/490, 307/492, 502, 529, 323; 327/334, 346, 349, 350, 355, 568, 569

[56] References Cited

U.S. PATENT DOCUMENTS

| | | | |
|---|---|---|---|
| 3,142,768 | 7/1964 | Kaufman | 327/570 |
| 3,202,921 | 8/1965 | Wissel | 307/325 |
| 3,242,416 | 3/1966 | White | 328/144 |
| 3,280,344 | 10/1966 | Ville | 327/499 |
| 3,284,794 | 11/1966 | Bean | 307/502 |
| 3,292,073 | 12/1966 | Jones et al. | 307/296.1 |
| 3,294,986 | 12/1966 | Pleshko | 327/570 |
| 3,321,642 | 5/1967 | Peterson | 307/323 |
| 3,436,683 | 4/1969 | Rogers | 307/318 |
| 3,441,728 | 4/1969 | Halfhill et al. | 328/144 |
| 3,458,728 | 7/1969 | Bentley et al. | 307/323 |
| 3,681,700 | 8/1972 | Rennick | 328/144 |
| 3,743,949 | 7/1973 | Engel et al. | 328/144 |
| 3,825,843 | 7/1974 | Felsburg et al. | 328/163 |
| 4,109,165 | 8/1978 | Katakura et al. | 328/145 |
| 4,418,317 | 11/1983 | Bateman | 328/145 |
| 4,435,677 | 3/1984 | Thomas | 328/144 |
| 4,445,053 | 4/1984 | Jaeger et al. | 328/144 |
| 4,467,442 | 8/1984 | Ramer | 328/144 |
| 4,507,577 | 3/1985 | Kwan | 328/144 |
| 4,777,471 | 10/1988 | Comer | 327/584 |
| 4,829,204 | 5/1989 | Harris, Jr. et al. | 328/160 |

FOREIGN PATENT DOCUMENTS

| | | | |
|---|---|---|---|
| 1003195 | 2/1989 | China . | |
| 46-35418 | 10/1971 | Japan | 328/160 |
| 1167080 | 10/1969 | United Kingdom | 328/144 |
| 0734861 | 5/1980 | U.S.S.R. | 328/160 |

OTHER PUBLICATIONS

Deiters; "Optimum Design of a Diode Squarer . . . "; Apr. 1964; pp. 456 & 457.
"Tunnel Diode Manual"; Mar. 1961; pp. 56–57.
"The Hoffman Tunnel Diode"; Dec. 1960; pp. 1–48.

*Primary Examiner*—Terry D. Cunningham
*Attorney, Agent, or Firm*—Ladas & Parry

[57] ABSTRACT

A series of squarer circuits each providing an ideal square law transfer character comprises at least one backward diode and a compensating resistor connected in series therewith. A second backward, diode can be included connected front to back with the one diode.

1 Claim, 1 Drawing Sheet

VOLTAGE SQUARER USING BACKWARD DIODES

This is a continuation of Ser. No. 07/692,188 filed on Apr. 26, 1991, now abandoned.

FIELD OF THE INVENTION

The present invention relates to an electronic device, more particularly, it relates to a device with a square-law transfer characteristic used in a non-linear circuit.

BACKGROUND OF THE INVENTION

An electronic device having a square-law transfer characteristic, i.e., a so-called squarer, is an assumed ideal device for theoretical study of non-linear circuits. Such ideal device, for example, has been mentioned in "Non-linear Circuit Handbook" (written by the Engineering Staff of Analog Devices Inc., published by Analog Devices inc. 1974).

The transfer characteristic of such an ideal device can be described with the following mathematical equation (1):

$$Uo=KUi^2 \quad (1)$$

where

| | |
|---|---|
| Uo—output | voltage |
| Ui—input | voltage |
| K—Constant | |

Up to now, such ideal device, which has been long sought, has not been satisfactorily realized in practice. The performance of existing square-law devices leaves much to be desired. The patent invention entitled "Wide Band Multiplier" (Chinese Patent No. CN 1003195B, filed on Jul. 25, 1986, announced on Feb. 1, 1989, granted on May 31, 1989), invented and filed by the same inventor of the present application, has advanced a great step towards the realization of such ideal device.

The prior art wideband multiplier is based on the conception that the backward breakdown characteristic of the backward diode is used as a conduction direction which exhibits a zero-feed through conduction characteristic, while the forward conduction characteristic of the same diode is used as the cut-off direction. One backward diode is connected with another backward diode in such a manner than when one backward diode conducts in its forward direction, the other backward diode conducts in its backward direction, and vice-versa. The multiplier constituted according to this conception provides a transfer characteristic such that the output current of the multiplier is substantially proportional to the square of the input voltage within a certain dynamic range, i.e., it has a characteristic, $i=ku^2$, where u is the input signal voltage, i is the output signal current and k is a constant. However, the multiplier still has the following defects: when the input voltage level is high, the transfer characteristic curve departs substantially from the square-law characteristic. Therefore, the dynamic range of this device is limited, and the difference between the transfer characteristics of an A. C. signal and a D.C. signal is large. Moreover, the output circuit to be connected with the output of the multiplier must be driven by the output current of the multiplier.

SUMMARY OF THE INVENTION

One object of the present invention is therefore to provide a square-law device, particularly, a squarer the output of which is closely approximate to an ideal square-law characteristic. That is, the transfer characteristic of a squarer according to the present invention is precisely in line with the square-law characteristic (i.e. $Uo=kUi^2$, where Ui is the input signal voltage, Uo is the output signal voltage and K is a constant) within a wide dynamic range and applicable to the frequency range from D.C. up to microwave frequency band.

Another object of the present invention is to provide a squarer which is adapted to various output circuits.

A further object of the present invention is to provide a low cost squarer.

To achieve these objects, an improvement on the disclosed patent invention CN10031953 mentioned above has been made. According to the present invention, a resistor R having a selected resistance is added to compensate the backward conduction characteristic of the backward diode so that the resultant characteristic is precisely in line with the square-law even when the input voltage level is high. In this way, the defects of the prior art as pointed out above are overcome, and the squarer according to the present invention has a square-law characteristic within a dynamic range much wider than that of the prior art. The output of the squarer of the present invention can be connected with a capacitor or a frequency selecting circuit. Optionally, the two output terminals of the squarer can be shorted together; thus the output signal can be directly obtained from the two ends of the compensating resistor R.

DESCRIPTION OF PREFERRED EMBODIMENTS OF THE PRESENT INVENTION

Figure 1:
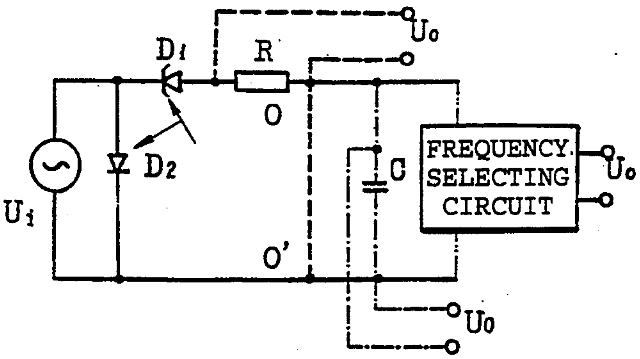
FIG. 1 is a schematic diagram showing a circuit of a one-quadrant squarer according to the present invention and connections between the squarer circuit and output circuits connected thereto.

FIG. 1 shows an embodiment of the squarer of the present invention comprising a combination of backward diodes D1 and D2 and compensating resistor R1 having a selected resistance. The cathode of diode D1 is directly connected to the anode of diode D2; one end of the compensating resistor R1 is connected to the anode of diode D1; and the other end of the compensating resistor R1 is connected to the one output of the squarer. The basic principle of operation of the squarer will now be described.

Figure 5:
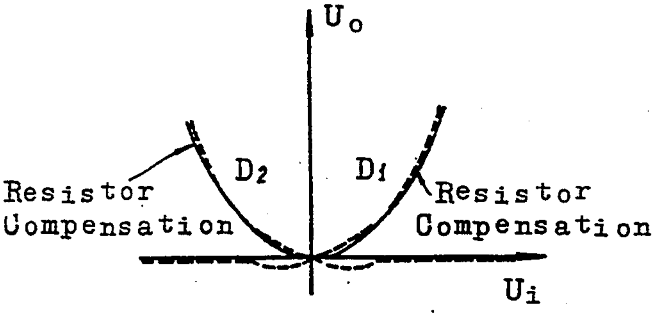
FIG. 5 shows the transfer characteristic curve in two quadrants with the combination of backward diode compensation and selected resistance resistor compensation according to the present invention.

The backward breakdown characteristic of backward diode D1 has a zero-feed through conduction characteristic as shown in the first quadrant of FIG. 5 by the dotted line. However, this characteristic curve deviates considerably from the square-law. To solve this problem, in this embodiment, when diode D1 becomes backward conducting, diode D2 becomes forward conducting, and therefore the peak current of diode D2 is combined with the forward conduction current of diode D1. As a result, the composite characteristic curve exhibits a precise square-law characteristic in the case of low level input voltages. Further, a resistor R1 having a selected resistance is used to compensate the backward conduction characteristic curve of backward diode D1 in the case of higher level voltages so that the resultant characteristic also assumes the precise square-law shape with such higher level input voltages. Thus, the whole resultant characteristic curve of the squarer of this embodiment, as shown in quadrant 1 of FIG. 5 by the solid line, has a square-law characteristic within a very wide dynamic range from the zero-feed through point up to a very high level.

In some applications, it is not necessary to have a precise square-law characteristic. In such instances, and in accordance with this invention, the diode D2 can be omitted. In such instance, the characteristic of the squarer departs somewhat from the ideal square-law with low level input voltages.

The squarer as shown in FIG. 1 is applicable in many applications. According to the circuit application, various circuits can be connected to different output terminals O and O′ shown in FIG. 1 by means of dotted lines, dashed lines and dot-dash lines, respectively. For example, if the output terminals O and O′ are connected to a capacitor (as shown by the dot-dash lines) having an appropriate capacitance, then a D.C. signal or a low frequency signal can be obtained via the capacitor. For obtaining an output signal at a particular frequency, for example, at a frequency twice the frequency of the input signal Uk; or for obtaining an upper sideband frequency signal of the input signals Ua and Ub, a corresponding frequency selecting circuit or filter designed for such purpose can be connected to the terminals O and O′ shown by the dotted lines. Also, a signal containing all of the frequency components produced by the squarer of the present invention in a square-law characteristic can be provided from the two terminals of the compensating resistor R1 when the output terminals O and O′ are short circuited, as shown by the dash lines. In all the cases mentioned above, the voltage values of the output signals are proportional to the square values of the input signal voltages.

Figure 2:
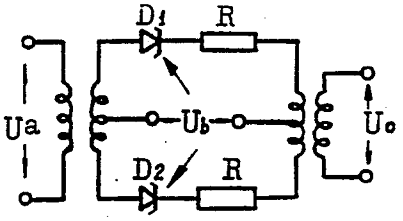
FIG. 2 is a schematic diagram showing a circuit of a two-quadrant squarer according to the present invention.
Figure 3:
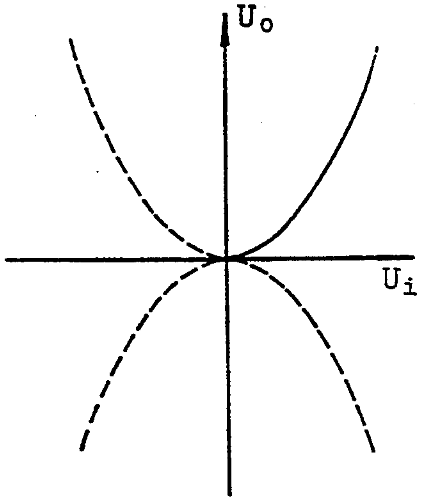
FIG. 3 shows the characteristic curve of a so-called ideal squarer.
Figure 4:
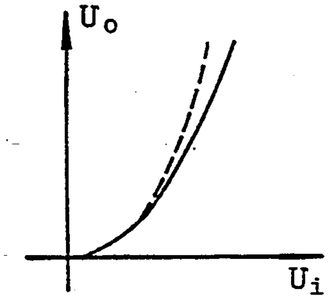
FIG. 4 shows the compensation for the backward conduction characteristic by adding a resistor having a selected resistance according to the present invention.

FIG. 2 shows another embodiment of the present invention. It is a two-quadrant squarer. It comprises a combination of backward diode D1 and compensating resistor R1 and another substantially identical combination of backward diode D2 and compensating resistor R2. The backward current of D1 is combined with the peak current of D2. In the same way, the backward current of D2 is combined with the peak current of D1. Two compensating resistors R having selected resistance are used for compensating the characteristic curves for higher input voltage levels. In this way, the composite transfer characteristic curve exhibits a precise square-law characteristic both for high and low levels in the case of higher level input voltages as shown in FIG. 5 by the solid line. Transformer T1 and T2 are provided to form a balanced input and output.

Figure 6:
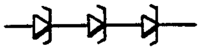
FIG. 6 shows a series connection of backward diodes for use in substitution of the single diodes shown in FIGS. 1–5.

In the same manner, various multiple-quadrant squarers, such as a two quadrant squarer, a four quadrant squarer, etc, can be formed. In order to further expand the dynamic range of the transfer characteristics, backward diodes D1 and D2 in the embodiments of the present invention can be replaced with a group of backward diodes connected in series as shown in FIG. 6. Thus, with the present invention, a series of new types of squarers can be formed having the following advantages.

The uncertainties of the X, Y axes are minimized; they have a square-law characteristic within an extremely wide dynamic range, and can be operated in a very wide frequency band. Also, they have fast response, low noise and good thermal stability characteristics. In addition to this, the input and output of the squarers of the present invention can be designed as balanced terminals (as shown in FIG. 2) or unbalanced terminals (as shown in FIG. 1), and the inputs of the squarers according to the present invention can be applied as a single signal or a plurality of signals. Moreover, the transfer characteristics of the squarers of the present invention can be expressed in the form of equation (1) mentioned above in the analysis of the non-linear circuit. For example, when two signals Ua and Ub are input to a four-quadrant squarer in balanced form (as shown in FIG. 2), the output signal of the squarer will nearly equal a pure product of Ua and Ub. As a result, because it is not necessary to expand the transfer characteristic in power series in analyzing relevant non-linear circuit, the design of frequency selecting and filtering circuits is made much simplifier. For example, some filtering circuits can be omitted. Moreover, because of the zero-feed through characteristic of the squarer of the present invention, a new method is provided for designing circuits including squarers of the present invention (low-level design method). With this method, the gain of the preceding stages of a circuit system can be reduced and the parts providing the most gain of the whole system are distributed to the post stage (s) of the system.

The series of squarers of the present invention provide a simple and easy method and apparatus for measurements of electronic signal power, true RMS value and noise with high accuracy, and can be applied for frequency transformation and phase transformation with good performance.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What are claimed is:

1. A squarer, comprising:

a first backward diode (D1) having an anode and a cathode;

a resistor (R) having one end connected to the anode of the first backward diode and having an opposite end;

a second backward diode (D2) having an anode connected to the cathode of the first backward diode and having a cathode; and input terminal means for applying an input voltage (Ui) across the anode and cathode of the second backward diode;

whereby an output voltage (Uo) from the cathode of the second backward diode to the opposite end of the resistor has the characteristic $Uo=KUi^2$, wherein K is a constant.

* * * * *